United States Patent
Zhang et al.

(10) Patent No.: US 11,272,133 B1
(45) Date of Patent: Mar. 8, 2022

(54) TIME-RESOLVED QUANTA IMAGE SENSOR

(71) Applicant: Gigajot Technology, Inc., Pasadena, CA (US)

(72) Inventors: Dexue Zhang, Arcadia, CA (US); Saleh Masoodian, Monrovia, CA (US); Jiaju Ma, Monrovia, CA (US)

(73) Assignee: Gigajot Technology, Inc., Pasadena, CA (US)

(*) Notice: Subject to any disclaimer, the term of this patent is extended or adjusted under 35 U.S.C. 154(b) by 38 days.

(21) Appl. No.: 17/074,475

(22) Filed: Oct. 19, 2020

Related U.S. Application Data

(60) Provisional application No. 62/916,886, filed on Oct. 18, 2019.

(51) Int. Cl.
| | |
|---|---|
| *H04N 5/3745* | (2011.01) |
| *H04N 5/378* | (2011.01) |
| *H04N 5/372* | (2011.01) |
| *H03F 3/45* | (2006.01) |

(52) U.S. Cl.
CPC ..... *H04N 5/37455* (2013.01); *H03F 3/45264* (2013.01); *H03F 3/45273* (2013.01); *H04N 5/372* (2013.01); *H04N 5/378* (2013.01); *H04N 5/3745* (2013.01); *H04N 5/37213* (2013.01)

(58) Field of Classification Search
CPC .. H04N 5/372; H04N 5/37213; H04N 5/3745; H04N 5/37452; H04N 5/37455; H04N 5/378; H03F 3/45264; H03F 3/45273
See application file for complete search history.

(56) References Cited

U.S. PATENT DOCUMENTS

| | | | |
|---|---|---|---|
| 4,565,971 A * | 1/1986 | Brookshire | H03F 3/45968 330/51 |
| 6,717,616 B1 | 4/2004 | Afghahi et al. | |
| 6,919,549 B2 | 7/2005 | Bamji et al. | |
| 7,081,608 B2 | 7/2006 | Bock | |
| 7,394,309 B1 * | 7/2008 | Potanin | H03F 3/45977 327/337 |
| 10,652,493 B2 | 5/2020 | Ladd et al. | |
| 2007/0177043 A1 | 8/2007 | Kok | |
| 2014/0054446 A1 * | 2/2014 | Aleksic | H01L 27/14609 250/208.1 |
| 2015/0009386 A1 * | 1/2015 | Komaba | H03M 1/123 348/308 |

OTHER PUBLICATIONS

Sato et al., "A 0.50e-rms Noise 1.45μm-Pitch CMOS Image Sensor with Reference-Shared In-Pixel Differential Amplifier at 8.3Mpixel 35fps," IEEE International Solid-State Circuits Conference, ISSCC 2020, Session 5, Imagers and ToF Sensors, 5.8, Feb. 2020, pp. 108-110 (3 pages).

* cited by examiner

*Primary Examiner* — Lin Ye
*Assistant Examiner* — Chriss S Yoder, III
(74) *Attorney, Agent, or Firm* — Charles Shemwell

(57) ABSTRACT

Multi-stage auto-zeroing signal amplifiers are deployed within event-shuttering pixels of a quanta image sensor (QIS) pixel array to enable reliable per-pixel reporting of photonic events, down to resolution of a single photon strike, for each of a continuous sequence of sub-microsecond event-detection intervals.

21 Claims, 4 Drawing Sheets

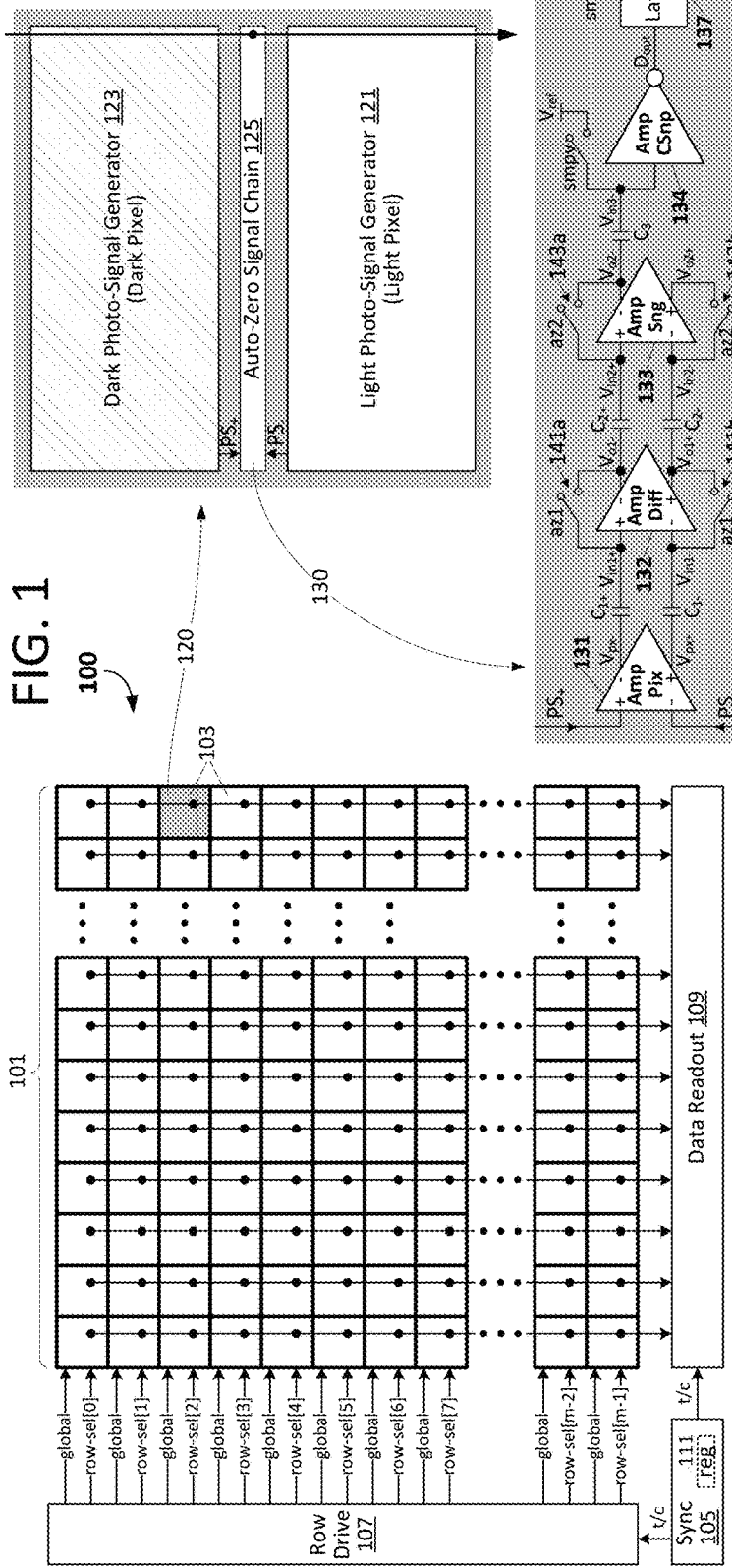
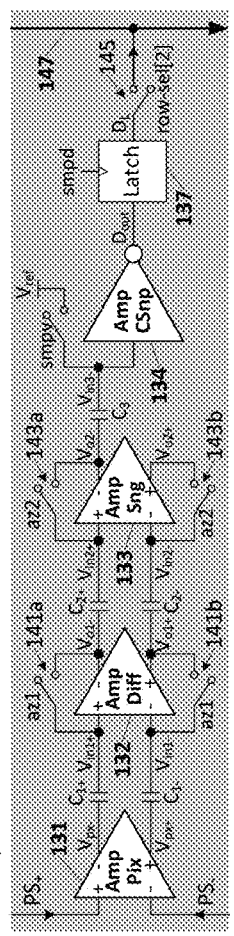
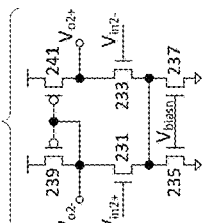
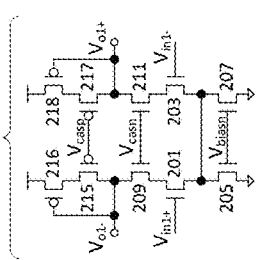
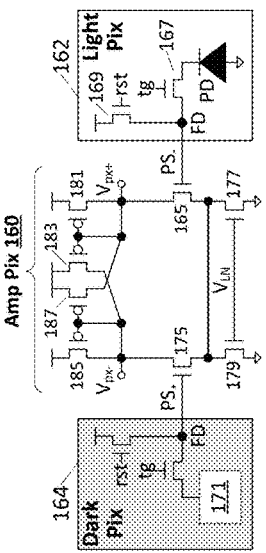

FIG. 7  Example of capacitor loading ($V_{C1+}$, $V_{C1-}$) over four 100ns event-detection windows in which photon strikes occur during windows 0, 1 and 3:

TIME-RESOLVED QUANTA IMAGE SENSOR

CROSS-REFERENCE TO RELATED APPLICATIONS

This application hereby claims priority to and incorporates by reference U.S. provisional application No. 62/916,886 filed Oct. 18, 2019.

TECHNICAL FIELD

The disclosure herein relates to high speed photonic detection.

DRAWINGS

The various embodiments disclosed herein are illustrated by way of example, and not by way of limitation, in the figures of the accompanying drawings and in which like reference numerals refer to similar elements and in which:

FIG. 1 illustrates a quanta image sensor (QIS) embodiment having an array of event-shuttering pixels;

FIG. 2 illustrates an embodiment of a differential pixel-signal amplifier together with interconnection to active (light) and reference (dark) photo-signal generators;

FIG. 3 illustrates an embodiment of a differential amplifier that may be deployed as the second-stage amplifier of FIG. 1;

FIG. 4 illustrates an amplifier embodiment that may be deployed as the third-stage, single-drive amplifier of FIG. 1;

FIG. 5 illustrates a single-ended common-mode amplifier that may be deployed within the FIG. 1 signal chain as final-stage amplifier;

Figure 7:
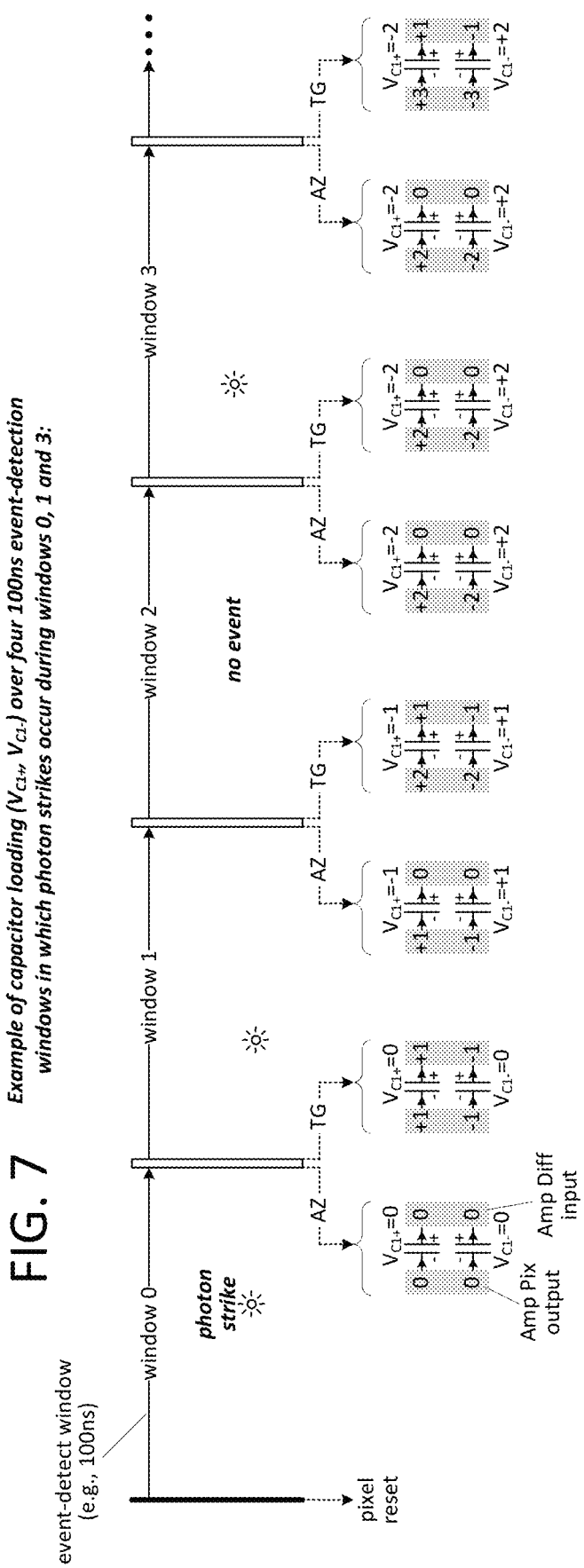
Figure 8:
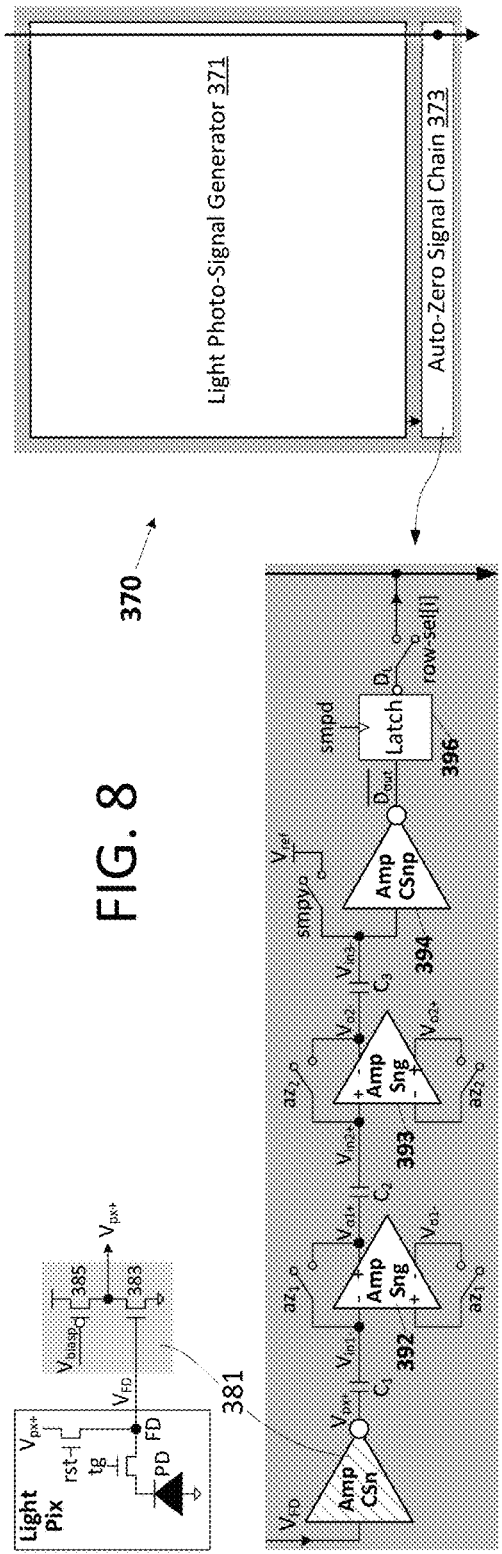
Figure 9:
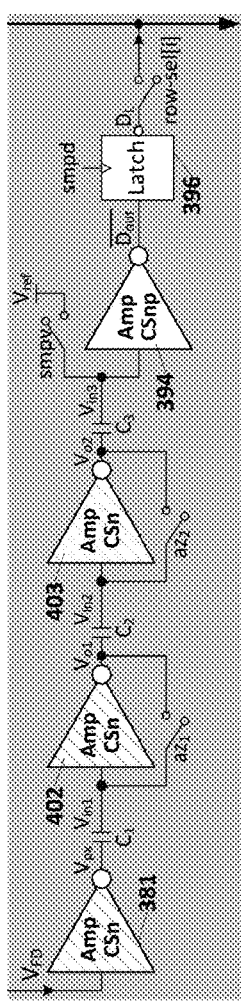
Figure 10:
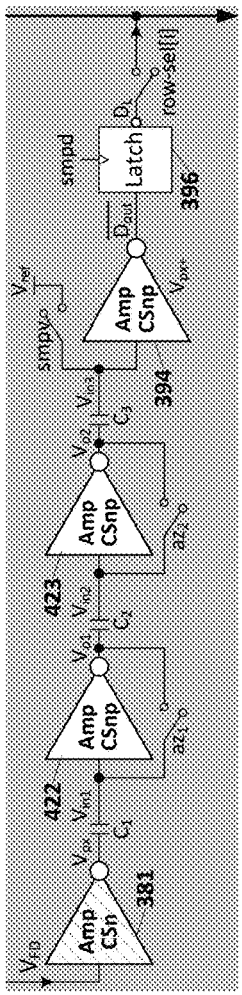

FIG. 7 illustrates coupling-capacitor charging over a sequence of four event detection windows in which photon strikes occur within windows 0, 1 and 3 (and not window 2), showing the escalating pixel-signal amplifier output and countervailing charge storage within the coupling capacitor;

FIG. 8 illustrates an alternative event-shuttering pixel embodiment having only an active (light-detecting) photo-signal generator (i.e., lacking the dark photo-signal generator shown in FIGS. 1 and 2) and thus providing a single-ended input to the signal output chain;

FIG. 9 illustrates an alternative single-ended signal output chain in which transistor count and thus signal-chain footprint is reduced by replacing the second-stage and third-stage single-drive differential amplifiers with single-ended common-source amplifiers; and FIG. 10 illustrates another single-ended signal output chain having potentially boosted gain relative to the signal output chain of FIG. 9.

DETAILED DESCRIPTION

In various embodiments disclosed herein, multi-stage auto-zeroing signal amplifiers are deployed within event-shuttering pixels of a quanta image sensor (QIS) pixel array to enable reliable per-pixel reporting of photonic events, down to resolution of a single photon strike, for each of a continuous sequence of extremely brief event-detection intervals. In a number of embodiments, for instance, the multi-stage signal amplifier within each QIS pixel generates a reliable and independent binary event-data output to signal occurrence or non-occurrence of an event for each of a sequence of 100 nanosecond or less event-detection intervals in which a photodetector output cumulatively decrements by as little as 1e– (single electron), executing an auto-zero "event shuttering" operation at the conclusion of each detection interval to prevent photonic event(s) within the concluding interval from influencing event-data generation for the subsequent interval. In a number of implementations, the multi-stage signal amplifier output is latched within a per-pixel latching element to enable pipelined pixel readout in which the binary output generated for a given event-detection interval is driven onto an output bit line of the pixel array concurrently with signal amplification for a subsequent event-detection interval. In those and other embodiments, event-detection intervals are implemented with uniform, global timing across the entire QIS pixel array, with sequential row-by-row data readout for a given event-detection interval carried out during a subsequent event-detection interval (i.e., global event-detection intervals, with row-by-row readout for one interval carried out during another later interval). Event-shuttering pixels are implemented with both active and inactive (light and dark) photo-signal generators in some embodiments (to supply differential photo-signals to the multi-stage auto-zeroing amplifier) and with only active photo-signal generators in others. In these and other implementations, cumulatively charged/discharged photodetection elements within respective pixels of the QIS pixel array may be reset after a programmable number of event-detection intervals to avoid photodetector saturation and thus enable application of the QIS pixel array with respect to a broad range of objective light intensities, including application in host systems or devices that permit auto- or user-controlled adjustment of objective light intensity.

FIG. 1 illustrates a QIS sensor embodiment 100 having an array 101 of event-shuttering pixels 103 together with a synchronizer 105, row-driver 107 and data readout unit 109. In the depicted example, row driver 105 issues global control signals to all constituent pixels of array 101 to implement synchronized array-wide (global) event shuttering—decomposition of a continuous exposure interval into a sequence of event-detection intervals that transpire simultaneously (starting and ending at the same time) within all event-shuttering pixels—and time-staggered row-select signals (row-sel[0], row-sel[1], row-sel[m–1]) to respective rows of event-shuttering pixels to effect row-by-row transfer of event data (captured within the pixel array for a given event detection interval) from the pixel array to data readout unit 109. Data readout unit 109 may receive timing and/or control signals ("t/c") from synchronizer 105 as necessary to time-stamp or otherwise accumulate and organize (or format) incoming event data, and may either export accumulated event data via a chip-to-chip signaling interface (e.g., export to a processing IC) or include circuitry to process the event data in whole or part. For example, time-resolved QIS sensor 100 may be implemented within a stacked-sensor structure (system-in-package, three-dimensional IC, etc.) having a pixel layer IC and an application-specific integrated-circuit (ASIC) layer.

Row driver 107 similarly receives timing and/or control signals from synchronizer 105, for example, to establish event interval duration and number of event intervals per photodetector reset within pixel array 101—operational parameters that may be programmed (e.g., in response to host-system instructions issued at system start-up or dynamically during system run-time) within programmable register 111 or other configuration circuitry within QIS sensor 100.

Referring to exemplary detail view 120, each event-shuttering pixel 103 includes active and inactive photo-signal generators 121, 123 that output event-positive and event-negative photo-signals ($PS_+$, $PS_-$, respectively) to an auto-zeroing chain of signal amplifiers 125 (i.e., multi-stage amplifier). In an embodiment shown in expanded view 130, the amplifier chain or "signal chain" includes, in order of signal progression from input to output, a pixel-signal amplifier 131, differential amplifier 132, single-drive amplifier 133, and final-stage common-source amplifier 134 with the final amplifier stage driving the data input of latching element 137. Auto-zeroing switch elements 141a, 141b (e.g., implemented by p-type and/or n-type metal oxide semiconductor (MOS) transistors) are coupled between each input of differential amplifier 132 (the "second stage" amplifier) and its opposite polarity output to enable auto-zeroing in response to global control signal az1 (an operation executed at conclusion of each event-shuttering interval as discussed below) and auto-zeroing switch elements 143a, 143b are likewise coupled between inputs and respective outputs of single-drive amplifier 133 (third stage) to enable auto-zeroing in response to global control signal az2. The output(s) of each amplifier stage are capacitively coupled to input(s) of the subsequent amplifier stage (i.e., capacitive elements $C_{1+}$, $C_{1-}$ coupled between outputs of first-stage amplifier 131 and inputs of second-stage amplifier 132; $C_{2+}$, $C_{2-}$ coupled between outputs of second-stage amplifier 132 and inputs of third-stage amplifier 133 and $C_3$ coupled between inverting output of third-stage amplifier 133 and the solitary input of final-stage amplifier 134) to provide common-mode isolation—an arrangement that enables the differential input of second-stage amplifier 132 to be zeroed (baselined) at conclusion of each event-detection interval without resetting photodetection elements within the photo signal generators, effectively shuttering the event detection interval in preparation for a new detection interval without suffering the kTC noise and settling delay of photodetector reset.

Still referring to detail view 130 of FIG. 1, the input to final-stage amplifier 134 (i.e., $V_{in3-}$) is also precharged (e.g., pulled up or down to Vref) in response to a reference-sample signal ("smpv") at conclusion of each event-detection interval to make ready for generation of final-stage output signal, $D_{out}$. After Dout stabilizes, a data-sample signal ("smpd") is asserted to latch the final-stage output as a CMOS-level event-data bit, $D_L$—a data bit read out of the pixel array via switching element 145 (e.g., a MOS transistor controlled by the row-select signal for the pixel row, "row-sel[2]" in the depicted example) and column output line 147 concurrently with other event-data bits from the same row of pixels. In the FIG. 1 embodiment, the auto-zeroing signals (az1, az2), reference-sample signal and data-sample signal are applied globally within pixel array, together with an optional transfer-gate signal (tg) as discussed below, to effect simultaneous event shuttering within all pixels of event-shuttering pixel array 101.

FIG. 2 illustrates an embodiment of a differential pixel-signal amplifier 160 (i.e., that may implement first-stage amplifier 131 of FIG. 1) together with interconnection to active (light) and reference (dark) photo-signal generators 162, 164. In the example shown, active photo-signal generator 162 and input transistor 165 of amplifier 160 collectively implement an active pixel—that is, a pixel having a photodetector PD (e.g., pinned photodiode), transfer gate 167, floating diffusion node FD (capacitive node), reset gate 169 and source-follower transistor with the latter, in this instance, serving as input transistor 165 of pixel-signal amplifier 160. At the start of an event-detection sequence, reset (rst) and transfer gate (tg) signals are pulsed (to switch on transistors 167 and 169) to precharge the floating diffusion node and photodiode and thus effect a pixel reset—an operation executed globally throughout the pixel array. A sequence of event detection intervals commences shortly thereafter (e.g., after a kTC-noise settling delay), with each detection interval or "window" concluding with a tg pulse on transfer gate 167 to enable any photocarrier(s) generated within the resident photodetector (photodiode PD in this example) during the concluded interval (i.e., one or more electrons released within n-type photodiode in response to incident light) to be transferred to the floating diffusion node and thus incrementally lower (decrement) output signal $PS_-$.

In the FIG. 2 embodiment, active and reference photo-signal generators 162, 164 are identically implemented with the important exception of the photodetection element—an element either lacking in part or whole within reference photo-signal generator 164 and/or shielded from exposure (optional implementations collectively represented by dashed element 171) so that no photonic events are detected or signaled on output signal $PS_+$. Accordingly, any photon strike within the photodetection element of active photo-signal generator will yield a voltage transition on output $PS_-$ (denoted with the '−' subscript due to the descending voltage step produced by n-type photodiode in response to each photon strike) while $PS_+$ remains unchanged, thus producing an incrementally increasing differential voltage at the inputs (gates of transistors 175 and 165) of pixel-signal amplifier over the sequence of event detection intervals that transpire between pixel reset operations. As discussed above, the number of event detection intervals per pixel reset may be programmed within the host QIS in accordance with anticipated photon detection rate, detection-interval duration and photodetector capacity (e.g., photowell size of photodiode PD in FIG. 2). For example, in an event-shuttering pixel array having a 100 ns detection interval and maximum anticipated incidence rate of 1 (photon)/50 ns, and for which each (per-pixel) photodetector is capable of storing 100 freed electrons (saturating at that charge level), event-detection intervals per reset may be programmed to ~50 to avoid photodetector saturation.

Still referring to FIG. 2, pixel-signal amplifier 160 includes aforementioned differential input nMOS transistors 175 and 165 having source terminals coupled in common to a current source (implemented by $V_{LN}$-biased nMOS transistors 177, 179) and drain terminals coupled to differential output nodes $V_{px+}$ and $V_{px-}$. The differential-output nodes are coupled respectively to gates of pMOS transistor pairs 181/183 and 185/187, and cross-coupled to drain terminals of one transistor in each of those pairs (i.e., $V_{px+}$ coupled to drains of transistors 181 and 187 while $V_{px-}$ is coupled to drains of transistors 183 and 185) to yield an amplified output differential (difference between $V_{px+}$ and $V_{px-}$) with a relatively stable common mode voltage as $PS_-$ cumulatively falls over successive event detection intervals (i.e., rise in $V_{px+}$ nominally matched by fall in $V_{px-}$ despite non-equal change in $PS_-$ and $PS_+$, with the latter remaining at steady state).

FIG. 3 illustrates an embodiment of a differential amplifier 200 (e.g., that may implement second-stage amplifier 132 of FIG. 1) having differential input transistors 201 and 203 with source terminals coupled in common to drain terminals of transistors 205 and 207 (the latter transistor pair implementing a current source controlled by $V_{biasn}$) and drain terminals coupled in a cascode configuration to source terminals of respective nMOS transistors 209 and 211 (i.e., ensuring high amplifier gain with sufficient bandwidth). The drain terminals of transistors 209 and 211 (which have gate terminals coupled to bias voltage $V_{casn}$) form the differential output (i.e., $V_{o1-}$ falling as $V_{in1+}$ rises) and are coupled, respectively, to the drain and gate terminals of cascode-configured pMOS transistor pairs 215/216 and 217/218. That is, $V_{o1-}$ is coupled to the drain of transistor 215 and gate of transistor 216 (those two transistors being coupled source-to-drain in series), while $V_{o1+}$ is coupled to the drain of transistor 217 and gate of transistor 218 (transistors 217 and 218 also coupled source-to-drain) with the gates of transistors coupled in common to bias voltage $V_{casp}$—an arrangement that obviates complex common-mode feedback circuitry (CMFB), saving substantial die area per pixel.

FIG. 4 illustrates an amplifier embodiment 230 that may be deployed as single-drive amplifier 133 of FIG. 1. As with amplifier 160 (FIG. 2), amplifier 233 includes differential input transistors (231, 233) having source terminals coupled in common to a bias controlled current source (i.e., implemented by transistors 235 and 237) and drain terminals coupled to respective drain terminals of pMOS transistors (239, 241). Transistors 239 and 241 are coupled in a current-mirror configuration (gates coupled together to output node $V_{o2-}$) so that current through transistors 239 and 241 increases as $V_{in2+}$ rises (and $V_{in2-}$ falls), raising $V_{o2+}$ relative to $V_{o2-}$ beyond the differential output achieved by a passive/fixed pull-up load.

FIG. 5 illustrates a single-ended input/output nMOS, pMOS common-mode amplifier 250 that may be deployed within the FIG. 1 signal chain as final-stage amplifier 134. As shown, amplifier 250 is effectively a complementary MOS inverter (i.e., common gates of series-coupled nMOS and pMOS transistors 251 and 253 forming the amplifier input and common drains of those transistors forming the amplifier output) that drives $D_{out}$ high when input $V_{in3-}$ is low and, conversely, drives Dout low when $V_{in3-}$ is high. In the FIG. 1/FIG. 5 embodiments, $V_{in3-}$ is precharged to Vref (i.e., in response to smpv signal assertion as discussed below) at conclusion of each event-detection interval to initialize $D_{out}$ to a logic-low state for that interval. If a photon strike occurred during the subject interval (lowering PS– and increasing $V_{px\pm}$ when the transfer-gate signal is pulsed), the signal chain will drive $V_{o2-}$ low and thus pull-down node $V_{in3-}$ (i.e., which will be floating at the precharged voltage level after smpv deassertion) to drive a high $D_{out}$ signal and thus signal the event detection.

Figure 6:
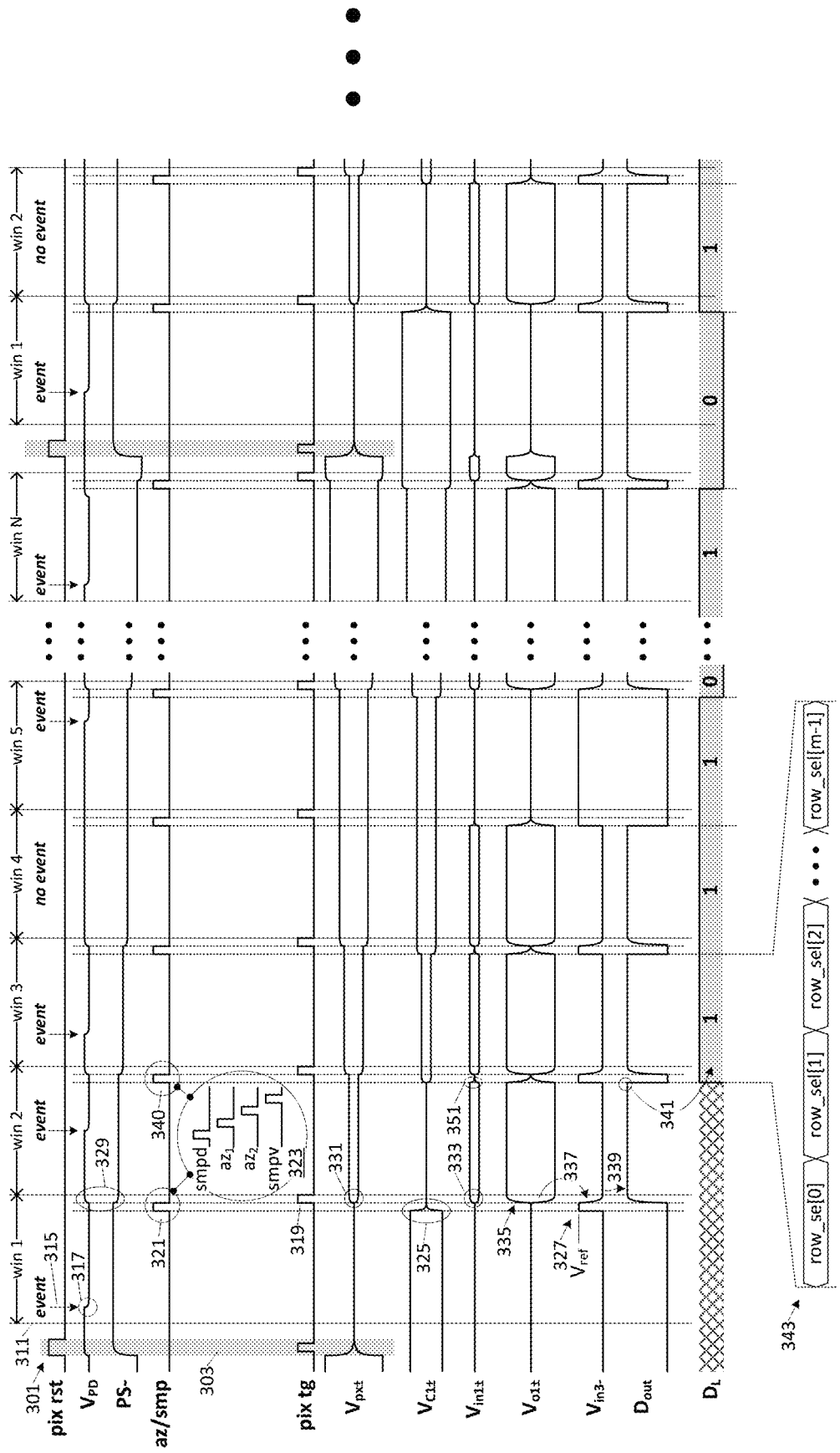
FIG. 6 illustrates an exemplary sequence of event-detection windows and pixel reset operations with respect to the event-shuttering quanta image sensor of FIG. 1, showing exemplary waveforms with respect to the auto-zeroing signal chain as implemented by amplifier stages according to FIGS. 2-5.

FIG. 6 illustrates an exemplary sequence of event-detection windows and pixel reset operations with respect to the event-shuttering quanta image sensor of FIG. 1, showing exemplary waveforms with respect to the auto-zeroing signal chain as implemented by amplifier stages according to FIGS. 2-5. Prior to each sequence of event detection intervals, a global pixel reset signal is pulsed concurrently with the transfer-gate signal as shown at 301 to reset the photo-signal generators within all event-shuttering pixels to a non-detect state (e.g., precharging the photodiode and floating diffusion node within photo-signal generator 162 of FIG. 2 and thus raising photodiode voltage $V_{PD}$ and floating diffusion voltage PS– as shown in shading 303) and thereby driving the output of the first-stage (pixel-signal) amplifier to a common-mode zero (i.e., $V_{px+}=V_{px-}$ as also shown in shading 303). Shortly after pixel reset, a sequence of N event-detection intervals or "windows" (win1, win2, win3, . . . , win N) commences at 311. If an event (e.g., photon strike) occurs as shown at 315 in the first detection window, the photodetector voltage (assuming an nMOS photodiode, for example) will drop as shown at 317. At conclusion of the first detection window, just prior to transfer gate assertion at 319, global control signals are asserted as shown at 321 and expanded view 323 to (i) latch the data generated for a preceding detection window (asserting smpd—assuming that there is no prior-window data to be latched in this initial-window case), (ii) auto-zero the stage-2 differential amplifier (pulsing az1), (iii) auto-zero the stage-3 single-drive amplifier (pulsing az2) and (iv) precharge the input to the final-stage common-source amplifier (pulsing smpv to precharge the amplifier input to Vref). Note that while the smpd, az1, az2 and smpv control pulses are shown as having same pulse-widths with staggered start times, all or any subset of the pulses may instead commence simultaneously but have falling edges staggered at the timing points shown (e.g., same start time, different pulse widths to yield time-staggered falling edges). As shown at 325 with respect to the voltage $V_{C1\pm}$ across the stage 1/stage 2 coupling capacitors $C_{1+}$ and $C_{1-}$ (depicted as a unified differential waveform), the az1 pulse discharges any voltage accumulated across those capacitors other than any fixed DC offset between the common mode voltages of the stage 1 and stage 2 amplifiers (i.e., the pixel-signal and differential amplifiers 131 and 132 of FIG. 1). Pulsing auto-zero signal az2 yields a similar zeroing/discharge with respect to the $C_{2+}$, $C_{2-}$ capacitors that couple the stage 2/stage 3 amplifiers (waveform not shown) and pulsing smpv precharges the input to the final-stage amplifier to Vref as shown at 327. Immediately following the global control signal pulse sequence at 321, the global transfer gate signal (pix tg or "tg") is pulsed at 319 to enable, within an active photo-signal generator according to FIG. 2, transfer of any event-generated photocharge from photodiode to floating diffusion node and thus yield, in this example in which a photonic event occurred during detection window 1, an incremental drop in photo-signal PS– and a corresponding rise in the photodiode voltage (i.e., as shown at 329—$V_{PD}$ restored to the nominal reset level as photocharge is conducted to the floating diffusion node, causing PS– to drop). The photo-signal drop at 329 produces an amplified output from the first-stage pixel-signal amplifier as shown at 331, which, due to the capacitor-isolated (and thus floating) inputs of the second-stage amplifier causes a corresponding voltage increase (333) at the differential input that amplifier (i.e., differential amplifier 132 in the FIG. 1 example) and thus an amplified output of that amplifier as shown at 335. The differential input to the third stage amplifier (e.g., single-drive amplifier 133 of FIG. 1) likewise matches the amplified output of the second stage amplifier to produce a further amplified third-stage differential output (not specifically shown in FIG. 6, but analogous to $V_{o1\pm}$), of which only the low-going component is supplied, via capacitor $C_3$, to the input of final-stage common-mode amplifier. Thus, $V_{in3-}$ drops in response to the event detection as shown at 337 to yield a logic-high data signal ($D_{out}$ goes high as shown at 339) at the output of the signal-inverting final-stage amplifier.

The global control sequence shown in detail view 323 is repeated at 340 (i.e., just prior to conclusion of detection window 2—a window in which an event is also detected), starting with assertion of the data-sampling signal (smpd) to latch the $D_{out}$ state generated at conclusion of window 1 within the output latch as shown at 341. Thus, the event-data output of the final amplifier stage for a given event-detection window 'i' is maintained through subsequent window i+1 and then maintained within the in-pixel data latch through yet more latent window i+2—a pipelined operation in which event detection occurs within the photo-signal generator during a given detection window, while the signal chain produces an amplified logic-level data output ($D_{out}$) for the preceding detection window and the data latch outputs the event data bit ($D_L$) for the two-interval-earlier window. As shown at 343, event-detection data for each row of pixels is read out in sequence throughout the data-latch interval between smpd rising (or falling) edges. In alternative embodiments, two or more column output lines may be provided per column of event-shuttering pixels to enable concurrent readout from multiple pixel rows and thereby halve (or more significantly reduce) the total pixel-array readout time—an approach that enables event detection windows to be shrunken potentially to the limit set by the signal output chain bandwidth.

Still referring to the control sequence 340 at conclusion of event-detection window 2, az1 assertion captures the non-zero voltage at the first-stage amplifier output (i.e., non-zero $V_{px\pm}$ level generated in response to the drop in PS_ following tg assertion at 319) within the stage1/stage2 coupling capacitors ($C_{1+}$, $C_{1-}$)—a charge storage operation that zeroes the differential voltage at the stage 2 input (i.e., drives the input to the amplifier common mode voltage) as shown at 352 despite the non-zero output from the prior amplifier stage (nonzero $V_{px\pm}$). FIG. 7 illustrates this operation over a sequence of four event detection windows in which photon strikes occur within windows 0, 1 and 3 (and not window 2), showing the escalating pixel-signal amplifier output (normalized to unit steps of ±1) following respective TG pulses at conclusions of windows 0, 1, and 3, and then the countervailing charge storage operations following respective auto-zero pulses (AZ) at conclusions of the ensuing windows. The net effect of this operation is to reset all amplifiers following the first-stage pixel-signal amplifier to the same initialization point (i.e., inputs and outputs zeroed to common mode voltage of the subject amplifier) at the start of signal amplification cycle—resetting the signal amplification chain to an event-detection baseline without the overhead (latency and noise) of resetting the pixel photodetection element and thus enabling reliable data output generation for events as singular as one photon strike (and corresponding electron release) over a sequence of exceedingly brief detection intervals (e.g., 100 ns or less per detection interval). The escalating first-stage amplifier output and countervailing charge storage on first-stage/second-stage coupling capacitors ($C_{1+}$, $C_{1-}$) can be seen also in the FIG. 6 example—$V_{px\pm}$ growing progressively larger in response to the event detections in windows 1-3 and $V_{C1\pm}$ increasing with one event-interval latency (and opposite polarity) to yield consistent differential input and output levels with respect to each of the amplifier stages downstream from the first-stage pixel-signal amplifier as shown by the $V_{in1\pm}$ and $V_{o1\pm}$ waveforms during detection windows 2, 3 and 4 (no event is detected in window 4, yielding a zeroed input and output for second-through-fourth stage amplifiers during subsequent window 5).

Still referring to FIG. 6, the Vref sampling operation at conclusion of each event-detection window (i.e., in response to smpv pulse as shown at 323) precharges the single-ended input of the final-stage amplifier ($V_{in3-}$) to Vref as shown at 327. If the output of the prior amplifier stage (i.e., $V_{o2-}$ which will have a profile corresponding to the lower half of the $V_{o1\pm}$ waveform) drops in response to an event detection during the just concluded detection window, the final-stage amplifier input will also drop as shown at 337, yielding a logic high data output at 339 to be latched as a logic '1' $D_L$ at the ensuing smpd assertion as discussed above and shown at 341.

FIG. 8 illustrates an alternative event-shuttering pixel embodiment 370 having only an active (light-detecting) photo-signal generator 371 (i.e., lacking the dark photo-signal generator shown in FIGS. 1 and 2) and thus providing a single-ended input to signal chain 373. In an embodiment shown in detail view 375, the initial amplifier within the signal output chain (i.e., corresponding to pixel-signal amplifier 131 in FIG. 1) is implemented by a common-source amplifier 381 having series coupled nMOS and pMOS transistors 383, 385 with the latter implementing a current source (i.e., pMOS transistor 385 biased by steady-state bias voltage $V_{biasp}$) and the latter driven by the pixel floating diffusion voltage $V_{FD}$ (or other photo-signal) to yield an amplified, polarity-inverted output signal, $V_{px+}$. During pixel reset (i.e., concurrent pulsing of reset and transfer-gate signals), $V_{FD}$ and $V_{px+}$ are shorted to reset the photodiode voltage and the output of the pixel amplifier to the same pre-determined value via nMOS transistor 383 (avoiding driving the output of amplifier 381 to either power rail at the end of pixel reset). The output of first-stage amplifier is capacitively coupled (via $C_1$) to a second-stage single-drive differential amplifier 392 implemented, for example, as shown in FIG. 4 and auto-zeroed (inputs coupled to opposite polarity outputs) in response to az1. The output of second-stage amplifier 392 is capacitively coupled (via $C_2$) to an identical third-stage amplifier 393 (e.g., implemented as shown in FIG. 4 and auto-zeroed in response to az2) which in turn drives, via capacitive coupling $C_3$, a Vref-precharged final-stage amplifier and data latch similar to signal chain 125 of FIG. 1 (i.e., final-stage amplifier 394 implemented by nMOS/pMOS common-source amplifier as shown, for example, in FIG. 5), but with inverted data state due to the odd number of signal inversions between the incoming photo-signal (VFD) and the input to final amplifier stage 394. In one embodiment, the inverted data state is accommodated by precharging the input to final-stage amplifier 394 (i.e., $V_{in3-}$) to a logic-low reference voltage (instead of a logic-high reference voltage) in response to smpv assertion. Latching element 396 may drive active-low event data onto the column output line or, as shown in FIG. 8, supply the event data to the output line via an inverting output to restore an active-high data state.

FIG. 9 illustrates an alternative single-ended signal output chain 401 in which transistor count and thus signal-chain footprint is reduced by replacing the second-stage and third-stage single-drive differential amplifiers shown at 392 and 393 in FIG. 8 with single-ended nMOS common-source amplifiers 402 and 403, each implemented as shown at 381 in FIG. 8 together with an az1-controlled auto-zero path between input and output. As in FIG. 8, the odd number of signal inversions between the incoming photo-signal ($V_{FD}$) and input to the final amplifier stage (i.e., producing a high-going Vol output at amplifier stage 403 in response to an event detection), the input to final-stage amplifier 394 may be precharged to a logic-low reference voltage (instead of a logic-high reference voltage), thus yielding an active-low data output signal (/$D_{out}$). As discussed above, latching element 396 may drive active-low event data onto the column output line or, as shown in FIG. 9, supply the event data to the output line via an inverting output to restore an active-high data state. In order to boost gain, the second and third stage nMOS common-source amplifiers in FIG. 9 (402, 403) may be replaced by nMOS/pMOS common-source amplifiers as shown at 422 and 423 in FIG. 10—an approach that leverages the transconductance of both constituent transistors (nMOS and pMOS as shown in FIG. 5) of those amplifiers.

The various QIS embodiments, event-shuttering pixel embodiments, signal output chains, operating methodology, implementing circuitry, host ICs and devices, etc. disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, layout, and architectural expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits and device architectures can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific time intervals, transistor types, signal polarities, array dimensions, operating frequencies, pulse widths, electron counts, photo-carrier polarity, detected/quantized phenomena, and the like can be different from those described above in alternative embodiments. Signal paths depicted or described as individual signal lines may instead be implemented by multi-conductor signal buses and vice-versa and may include multiple conductors per conveyed signal (e.g., differential or pseudo-differential signaling). The term "coupled" is used herein to express a direct connection as well as a connection through one or more intervening functional components or structures. Programming of operational parameters (pixel-array reset frequency, event-detection intervals per reset, detection interval duration, etc.) or any other configurable parameters may be achieved, for example and without limitation, by loading a control value into a register or other storage circuit within the above-described imaging IC in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated-circuit pixel comprising:
a photo-signal generator to generate a first signal indicative of photocharge accumulated within the pixel during a first event-detection interval;
a first capacitive element;
a first amplifier having an input coupled to receive the first signal via the first capacitive element and an output to produce a second signal that is an amplified version of the first signal; and
one or more switching elements to switchably couple the input and output of the first amplifier to (i) restore a baseline voltage at the input of the first amplifier and (ii) charge the first capacitive element to a voltage corresponding to potential difference between the baseline voltage and the first signal.

2. The integrated-circuit pixel of claim 1 wherein the photo-signal generator cumulatively adjusts a voltage level of the first signal in response to photocharge accumulation within the pixel during each of a plurality of additional event-detection intervals that transpire after the first event-detection interval.

3. The integrated-circuit pixel of claim 2 wherein the first amplifier re-generates the second signal in response to each cumulative adjustment in the voltage level of the first signal.

4. The integrated-circuit pixel of claim 2 wherein the one or more switching elements switchably couple the input of the first amplifier to the output of the first amplifier following each re-generation of the second signal to cumulatively charge the first capacitive element.

5. The integrated-circuit pixel of claim 4 wherein the one or more switching elements to switchably couple the input of the first amplifier to the output of the first amplifier to cumulatively charge the first capacitor comprises circuitry to cumulatively charge the first capacitor in proportion to cumulative adjustment of the voltage level of the first signal during each of the plurality of additional event-detection intervals.

6. The integrated-circuit pixel of claim 1 wherein the photo-signal generator to generate the first signal indicative of photocharge accumulated within the pixel during the first event-detection interval comprises a photodetection element, floating diffusion node and transfer gate to transfer photocharge, freed by a solitary photon strike within the photodetection element, from the photodetection element to the floating diffusion node.

7. The integrated-circuit pixel of claim 6 wherein the photo-signal generator to generate the first signal further comprises at least part of a common-source amplifier that amplifies a voltage level of the floating diffusion node to produce the first signal.

8. The integrated-circuit pixel of claim 1 further comprising a storage latch to latch a data bit having either a first logic state or a second logic state according to a voltage level of the second signal, the first logic state indicating event detection within the pixel during the first event-detection interval the second logic state indicating lack of event detection within the pixel during the first event-detection interval.

9. The integrated-circuit pixel of claim 8 wherein the first amplifier outputs the second data signal during a second event-detection interval that transpires after the first event-detection interval and the storage latch outputs the data bit during a third event-detection interval that transpires after the second event-detection interval.

10. The integrated-circuit pixel of claim 8 further comprising a sequence of one or more additional amplifier stages having an input capacitively coupled to the output of the first amplifier stage and an output to produce a third signal that is amplified relative to the second signal, and wherein the storage latch to latch the data bit in either the first logic state or the second logic state according to the voltage level of the second signal comprises circuitry to latch the data bit in the first logic state or the second logic state according to a voltage level of the third signal.

11. A method of operation within an integrated-circuit pixel, the method comprising:
    generating a first signal indicative of photocharge accumulated within the pixel during a first event-detection interval;
    generating, at an output of a first amplifier having an input coupled to receive the first signal via a first capacitive element, a second signal that is an amplified version of the first signal; and
    after generating the second signal, switchably coupling the input of the first amplifier to the output of the first amplifier to (i) restore a baseline voltage at the input of the first amplifier and (ii) charge the first capacitive element to a voltage corresponding to potential difference between the baseline voltage and the first signal.

12. The method of claim 11 further comprising cumulatively adjusting a voltage level of the first signal in response to photocharge accumulation within the pixel during each of a plurality of additional event-detection intervals that transpire after the first event-detection interval.

13. The method of claim 12 further comprising re-generating the second signal at the output of the first amplifier in response to each cumulative adjustment in the voltage level of the first signal.

14. The method of claim 12 further comprising switchably coupling the input of the first amplifier to the output of the first amplifier following each re-generation of the second signal to cumulatively charge the first capacitive element.

15. The method of claim 14 wherein switchably coupling the input of the first amplifier to the output of the first amplifier to cumulatively charge the first capacitive element comprises cumulatively charging the first capacitive element in proportion to cumulative adjustment of the voltage level of the first signal during each of the plurality of additional event-detection intervals.

16. The method of claim 11 wherein generating the first signal indicative of photocharge accumulated within the pixel during the first event-detection interval comprises transferring photocharge, freed by a solitary photon strike within the pixel, from a photodetection element to a floating diffusion node.

17. The method of claim 16 wherein generating the first signal further comprises amplifying a voltage level of the floating diffusion node within a common-source amplifier to produce the first signal.

18. The method of claim 11 further comprising latching a data bit within a storage latch, the data bit having either a first logic state or a second logic state according to a voltage level of the second signal, the first logic state indicating event detection within the pixel during the first event-detection interval the second logic state indicating lack of event detection within the pixel during the first event-detection interval.

19. The method of claim 18 wherein generating the second data signal comprises outputting the second data signal from the first amplifier during a second event-detection interval that transpires after the first event-detection interval and wherein latching the data bit within the storage latch comprises outputting the data bit from the storage latch during a third event-detection interval that transpires after the second event-detection interval.

20. The method of claim 18 further comprising generating, at an output of a sequence of one or more additional amplifier stages having an input capacitively coupled to the output of the first amplifier stage, a third signal that is amplified relative to the second signal, and wherein latching the data bit having either the first logic state or the second logic state according to the voltage level of the second signal comprises latching the data bit in the first logic state or the second logic state according to a voltage level of the third signal.

21. An integrated-circuit pixel comprising:
    means for generating a first signal indicative of photocharge accumulated within the pixel during a first event-detection interval;
    means for generating, at an output of a first circuit having an input coupled to receive the first signal via a first capacitive element, a second signal that is an amplified version of the first signal; and
    means for switchably coupling the input of the first circuit to the output of the first circuit, after generation of the second signal, to (i) restore a baseline voltage at the input of the first amplifier and (ii) charge the first capacitive element to a voltage corresponding to potential difference between the baseline voltage and the first signal.

* * * * *